(12) United States Patent
Honaga et al.

(10) Patent No.: US 8,450,750 B2
(45) Date of Patent: May 28, 2013

(54) SILICON CARBIDE SEMICONDUCTOR DEVICE AND METHOD OF MANUFACTURING THEREOF

(75) Inventors: Misako Honaga, Osaka (JP); Shin Harada, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/130,986

(22) PCT Filed: Jan. 27, 2010

(86) PCT No.: PCT/JP2010/051034
§ 371 (c)(1),
(2), (4) Date: May 24, 2011

(87) PCT Pub. No.: WO2011/092808
PCT Pub. Date: Aug. 4, 2011

(65) Prior Publication Data
US 2011/0297963 A1 Dec. 8, 2011

(51) Int. Cl.
*H01L 29/15* (2006.01)

(52) U.S. Cl.
USPC 257/77; 438/931; 257/E21.054; 257/E21.541; 257/E21.055; 257/E21.065; 257/E21.605

(58) Field of Classification Search
USPC ............ 257/77, E21.241, E29.068, E29.262, 257/E21.054, E21.605, E21.055, E21.065, 257/E21.541; 438/778, 931
See application file for complete search history.

(56) References Cited

U.S. PATENT DOCUMENTS

| | | | |
|---|---|---|---|
| 5,696,396 | A | 12/1997 | Tokura et al. |
| 6,734,461 | B1 | 5/2004 | Shiomi et al. |
| 2005/0077569 | A1 | 4/2005 | Yamashita et al. |

FOREIGN PATENT DOCUMENTS

| | | | |
|---|---|---|---|
| JP | 7-142722 | A | 6/1995 |
| JP | 2001-144288 | A | 5/2001 |
| JP | 2002-261275 | A | 9/2002 |
| JP | 2003-095797 | A | 4/2003 |
| JP | 2005-136386 | A | 5/2005 |
| JP | 2005-340685 | A | 12/2005 |
| JP | 2006-156478 | A | 6/2006 |
| JP | 2007-258465 | A | 10/2007 |
| JP | 2009-158933 | A | 7/2009 |
| JP | 2009-164571 | A | 7/2009 |
| JP | 2010-040564 | A | 2/2010 |
| WO | WO-01/18872 | A1 | 3/2001 |

OTHER PUBLICATIONS

Notice of Grounds of Rejection in Japanese Patent Application No. 2008-198351, dated Mar. 5, 2013.

*Primary Examiner* — Julio J Maldonado
*Assistant Examiner* — Amar Movva
(74) *Attorney, Agent, or Firm* — Venable LLP; Michael A. Sartori; Tamatane J. Aga

(57) ABSTRACT

A silicon carbide semiconductor device is provided that includes a semiconductor layer made of silicon carbide and having a surface with a trench having a sidewall formed of a crystal plane tilted at an angle in a range of not less than 50° and not more than 65° relative to the {0001} plane, and an insulating film formed to contact the sidewall of the trench. A maximum value of the nitrogen concentration in a region within 10 nm from the interface between the sidewall of the trench and the insulating film is not less than $1 \times 10^{21}$ cm$^{-3}$, and the semiconductor device has a channel direction in a range of ±10° relative to the direction orthogonal to the <−2110> direction in the sidewall of the trench. A method of manufacturing the silicon carbide semiconductor device is also provided.

9 Claims, 6 Drawing Sheets

SILICON CARBIDE SEMICONDUCTOR DEVICE AND METHOD OF MANUFACTURING THEREOF

TECHNICAL FIELD

The present invention relates to a silicon carbide semiconductor device and a method of manufacturing thereof, and particularly to a silicon carbide semiconductor device exhibiting excellent electrical characteristics and a method of manufacturing thereof.

BACKGROUND ART

Conventionally, silicon carbide semiconductor devices in which silicon carbide (SiC) is used have been known, and an example of them is disclosed in International Patent Publication WO01/018872 (hereinafter "Patent Document 1") for example. Patent Document 1 discloses a MOS-type field effect transistor (MOSFET) that is formed as a silicon carbide semiconductor device using an SiC substrate of the 4H polytype having a surface orientation of substantially {03-38}. According to Patent Document 1 disclosing the MOSFET, a gate oxide film is formed by dry oxidation and a high channel mobility (about 100 cm$^2$/Vs) can be achieved.

PRIOR ART DOCUMENTS

Patent Documents

Patent Document 1: International Patent Publication WO01/018872

SUMMARY OF THE INVENTION

Problems to be Solved by the Invention

In order for a silicon carbide semiconductor device in which SiC is used to stably exhibit its excellent electrical characteristics, it is required to achieve a high channel mobility with high reproducibility.

The inventors of the present invention have conducted studies to found, however, that even the MOSFET disclosed in Patent Document 1 may not have a sufficiently high channel mobility depending on the case.

In view of the circumstances above, an object of the present invention is to provide a silicon carbide semiconductor device capable of achieving a high channel mobility with high reproducibility, and a method of manufacturing the same.

Means for Solving the Problems

The present invention is a silicon carbide semiconductor device including: a semiconductor layer made of silicon carbide and having a surface with a trench having a sidewall formed of a crystal plane tilted at an angle in a range of not less than 50° and not more than 65° relative to a {0001} plane; and an insulating film formed to contact the sidewall of the trench, a maximum value of a nitrogen concentration in a region within 10 nm from an interface between the sidewall of the trench and the insulating film is not less than 1×10$^{21}$ cm$^{-3}$, and the silicon carbide semiconductor device has a channel direction in a range of ±10° relative to a direction orthogonal to a <-2110> direction in the sidewall of the trench.

Further, the present invention is a silicon carbide semiconductor device including: a substrate made of silicon carbide of a first conductive type; a semiconductor layer made of silicon carbide of the first conductive type, formed on the substrate, containing a first-conductive-type impurity of a lower concentration than the substrate, and having a surface with a trench having a sidewall formed of a crystal plane tilted at an angle in a range of not less than 50° and not more than 65° relative to a {0001} plane; a second-conductive-type impurity diffusion layer formed in the sidewall of the trench; a first-conductive-type impurity diffusion layer formed in the surface of the semiconductor layer; an insulating film formed to contact the sidewall of the trench; a source electrode formed to contact at least a part of a region, except for a portion where the insulating film is formed, of the surface of the semiconductor layer; a gate electrode formed on the insulating film; and a drain electrode formed on a surface of the substrate opposite to a surface of the substrate on which the semiconductor layer is formed. A maximum value of a nitrogen concentration in a region within 10 nm from an interface between the sidewall of the trench and the insulating film is not less than 1×10$^{21}$ cm$^{-3}$, and the silicon carbide semiconductor device has a channel direction in a range of ±10° relative to a direction orthogonal to a <-2110> direction in the sidewall of the trench.

Preferably, in the silicon carbide semiconductor device of the present invention, the source electrode has a surface in a stripe pattern.

Preferably, in the silicon carbide semiconductor device of the present invention, the source electrode has a surface in a honeycomb pattern.

Preferably, in the silicon carbide semiconductor device of the present invention, the sidewall of the trench is formed of a crystal plane tilted at an angle of ±5° relative to a {03-38} plane.

Further, the present invention is a method of manufacturing a silicon carbide semiconductor device, including the steps of: forming a trench having a sidewall formed of a crystal plane tilted at an angle in a range of not less than 50° and not more than 65° relative to a {0001} plane, in a surface of a semiconductor layer made of silicon carbide; forming an insulating film contacting the sidewall of the trench so that a channel direction is set in a range of ±10° relative to a direction orthogonal to a <-2110> direction in the sidewall of the trench; and adjusting a nitrogen concentration so that a maximum value of the nitrogen concentration in a region within 10 nm from an interface between the sidewall of the trench and the insulating film is not less than 1×10$^{21}$ cm$^3$.

Preferably, regarding the method of manufacturing a silicon carbide semiconductor device of the present invention, the channel direction is set in a range of ±10° relative to the direction orthogonal to the <-2110> direction in the sidewall of the trench, based on an orientation of a defect included in the semiconductor layer.

Preferably, regarding the method of manufacturing a silicon carbide semiconductor device of the present invention, the step of adjusting the nitrogen concentration includes the step of performing a heat treatment in an atmosphere of a gas containing nitrogen, on the semiconductor layer where the insulating film is formed.

Preferably, regarding the method of manufacturing a silicon carbide semiconductor device of the present invention, the step of adjusting the nitrogen concentration includes the step of performing, on the semiconductor layer having undergone the heat treatment, a heat treatment in an atmosphere of an inert gas.

Effects of the Invention

The present invention can provide a silicon carbide semiconductor device that can achieve a high channel mobility with high reproducibility, as well as a method of manufacturing the same.

MODES FOR CARRYING OUT THE INVENTION

Figure 1:
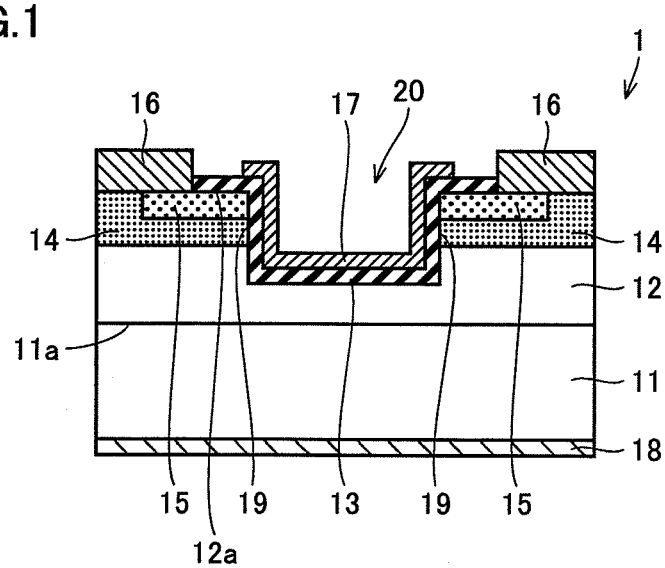
FIG. 1 is a schematic cross section of an example of a vertical trench gate MOSFET that is an example of the silicon carbide semiconductor device of the present invention.

An embodiment of the present invention will hereinafter be described. In the drawings of the present invention, the same reference characters denote the same or corresponding parts.

Where crystal plane and direction are to be expressed, they should actually be expressed with a bar on a required number. Because of restricted expression means, however, they are expressed in the present invention with "-" added before a required number instead of a bar on the required number. Further, in the present invention, an individual orientation is denoted in [ ], a group orientation is denoted in < >, an individual plane is denoted in ( ) and a group plane is denoted in { }.

FIG. 1 shows a schematic cross section of an example of a vertical trench gate MOSFET (Metal Oxide Semiconductor Field Effect Transistor) that is an example of the silicon carbide semiconductor device of the present invention.

A silicon carbide semiconductor device 1 shown in FIG. 1 includes a substrate 11 made of silicon carbide of n type and 4H—SiC polytype for example, a semiconductor layer 12 made of silicon carbide of n type formed on a surface 11a of substrate 11, a trench 20 formed in a surface 12a of semiconductor layer 12, a second-conductive-type impurity diffusion layer 14 that is a p-type region formed in surface 12a of semiconductor layer 12, a first-conductive-type impurity diffusion layer 15 that is an n-type region formed in a surface of second-conductive-type impurity diffusion layer 14 (also in surface 12a of semiconductor layer 12), an insulating film 13 formed on a part of surface 12a of semiconductor layer 12 to contact a sidewall 19 of trench 20, a source electrode 16 formed in a region of surface 12a of semiconductor layer 12 other than a region where insulating film 13 is formed, a gate electrode 17 formed on a surface of insulating film 13, and a drain electrode 18 formed on the back surface of substrate 11.

Here, as surface 11a of substrate 11 on which semiconductor layer 12 is formed, a crystal plane that is a {04-4-3} plane for example may be used.

Further, as semiconductor layer 12, a layer such as a layer made of silicon carbide of n type having a lower n-type impurity concentration than substrate 11 for example may be used.

Further, sidewall 19 of trench 20 formed in surface 12a of semiconductor layer 12 is formed of a crystal plane tilted at an angle in a range of not less than 50° and not more than 65° relative to the {0001} plane.

Further, as insulating film 13, a film such as an oxide film formed for example by dry oxidation (thermal oxidation) or the like may be used. Insulating film 13 is not limited to a single-layer structure, and may be of a structure including two or more layers.

Further, as second-conductive-type impurity diffusion layer 14, a layer such as a p-type region may be used that is formed by diffusing a p-type impurity serving as a second-conductive-type impurity in surface 12a of semiconductor layer 12, for example. Here, as the p-type impurity serving as a second-conductive-type impurity, aluminum, boron, or the like may be used, for example. Furthermore, in at least a part of a region excluding the region where first-conductive-type impurity diffusion layer 15 is formed in the surface of second-conductive-type impurity diffusion layer 14, a p+-type region containing a p-type impurity serving as a second-conductive-type impurity and having a higher concentration than second-conductive-type impurity diffusion layer 14 may be formed.

Further, as first-conductive-type impurity diffusion layer 15, a layer such as an n-type region that is formed by diffusing an n-type impurity serving as a first-conductive-type impurity in surface 12a of semiconductor layer 12 may be used, for example. The n-type impurity concentration of first-conductive-type impurity diffusion layer 15 may be made higher than the n-type impurity concentration of semiconductor layer 12. Here, as the n-type impurity serving as a first-conductive-type impurity, nitrogen, phosphorous or the like may be used, for example.

Further, for source electrode 16, gate electrode 17, and drain electrode 18 each, a conventionally known metal or the like may be used, for example.

In silicon carbide semiconductor device 1 shown in FIG. 1, a maximum value of the nitrogen concentration in a region within 10 nm from the interface between sidewall 19 of trench 20 and insulating film 13 is not less than $1 \times 10^{21}$ cm$^{-3}$. Here, the region within 10 nm from the interface between sidewall 19 of trench 20 and insulating film 13 refers to a region made up of: a region extending from the interface between sidewall 19 of trench 20 and insulating film 13 perpendicularly to the interface toward sidewall 19 side of trench 20 by 10 nm, and a region extending from the interface between sidewall 19 of trench 20 and insulating film 13 perpendicularly to the interface toward insulating film 13 side by 10 nm.

Figure 2:
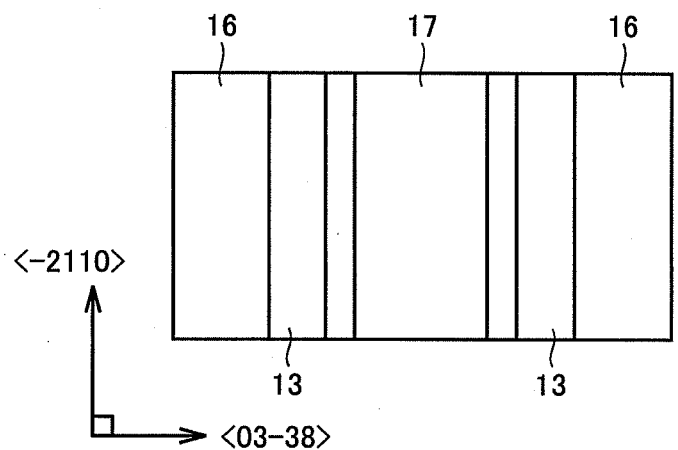
FIG. 2 is a schematic plan view of the silicon carbide semiconductor device shown in FIG. 1 as seen from a gate electrode side.

FIG. 2 shows a schematic plan view of silicon carbide semiconductor device 1 shown in FIG. 1 as seen from gate electrode 17 side. Here, the surface of source electrode 16 and the surface of gate electrode 17 are formed to extend in a stripe pattern in the <−2110> direction. Further, along the <03-38> direction which is perpendicular to the <−2110> direction, source electrode 16 and gate electrode 17 are alternately arranged, and one gate electrode 17 is disposed between two source electrodes 16. Further, from a gap between source electrode 16 and gate electrode 17, a surface of insulating film 13 is exposed. Thus, where the surface of source electrode 16 has the stripe pattern, the channel direction tends to be set easily in a range of ±10° relative to the direction orthogonal to the <−2110> direction, in sidewall 19 (crystal plane tilted by an angle in a range of not less than 50° and not more than 65° relative to the {0001} plane) of trench 20 as described later herein. In the present invention, the channel direction means the direction in which carriers move in sidewall 19 of trench 20.

Here, the channel direction of silicon carbide semiconductor device 1 with the above-described structure is set to be included in a range of ±10° relative to the direction orthogonal to the <−2110> direction, in sidewall 19 of trench 20 that is formed of a crystal plane tilted by an angle in a range of not less than 50° and not more than 65° relative to the {0001} plane.

In the following, a description will be given of an example of the method of manufacturing silicon carbide semiconductor device 1 having the above-described structure. First, as shown in a schematic cross section of FIG. 3, substrate 11 made of silicon carbide (4H—SiC) having surface 11a formed of a crystal plane that is a {04-4-3} plane for example is prepared.

Figure 4:
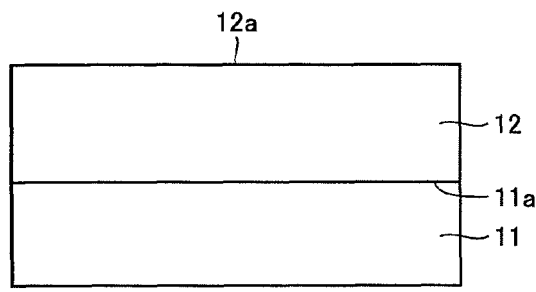
FIG. 4 is a schematic cross section illustrating a part of the manufacturing process of an example of the method of manufacturing a silicon carbide semiconductor device of the present invention.

Next, as shown in a schematic cross section of FIG. 4, semiconductor layer 12 is formed on surface 11a of substrate 11.

Here, semiconductor layer 12 may be formed for example by epitaxial growth or the like of semiconductor layer 12 made of n-type silicon carbide having an n-type impurity with a lower concentration than substrate 11, on surface 11a of substrate 11. Where semiconductor layer 12 is formed by the above-described epitaxial growth, surface 12a of semiconductor layer 12 is allowed to have the same crystal plane as surface 11a of substrate 11. Therefore, if surface 11a of substrate 11 is formed for example of a crystal plane that is a {04-4-3} plane, surface 12a of semiconductor layer 12 is allowed to have a crystal plane that is a {04-4-3} plane as well, as shown in the schematic plan view of FIG. 5 for example.

Figure 6:
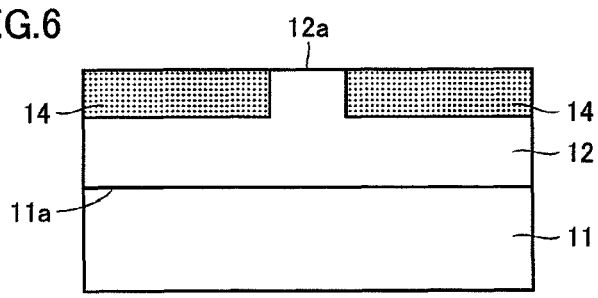
FIG. 6 is a schematic cross section illustrating a part of the manufacturing process of an example of the method of manufacturing a silicon carbide semiconductor device of the present invention.

Next, as shown in a schematic cross section of FIG. 6, second-conductive-type impurity diffusion layer 14 is formed in surface 12a of semiconductor layer 12. In this example, second-conductive-type impurity diffusion layer 14 is formed in a stripe pattern extending in the <−2110> direction. Second-conductive-type impurity diffusion layer 14, however, is not limited to this form.

Here, second-conductive-type impurity diffusion layer 14 may be formed for example by ion implantation or the like in which ions of a p-type impurity serving as a second-conductive-type impurity are implanted into surface 12a of semiconductor layer 12, after an ion implantation block mask is placed in a region other than the region where second-conductive-type impurity diffusion layer 14 is to be formed in surface 12a of semiconductor layer 12. As the ion implantation block mask, an oxide film or the like that has been patterned by photolithography and etching for example may be used.

Figure 7:
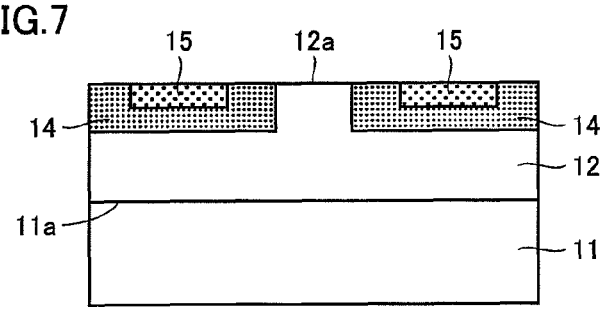
FIG. 7 is a schematic cross section illustrating a part of the manufacturing process of an example of the method of manufacturing a silicon carbide semiconductor device of the present invention.

Next, as shown in a schematic cross section of FIG. 7, first-conductive-type impurity diffusion layer 15 is formed in a surface of second-conductive-type impurity diffusion layer 14 formed in the above-described manner. In this example, first-conductive-type impurity diffusion layer 15 is also formed in a stripe pattern extending in the <−2110> direction. First-conductive-type impurity diffusion layer 15, however, is not limited to this form.

Here, first-conductive-type impurity diffusion layer 15 may be formed for example by ion implantation or the like in which ions of an n-type impurity serving as a first-conductive-type impurity are implanted into surface 12a of semiconductor layer 12, after an ion implantation block mask is placed in a region other than the region where first-conductive-type impurity diffusion layer 15 is to be formed in surface 12a of semiconductor layer 12. As the ion implantation block mask, an oxide film or the like that has been patterned by photolithography and etching for example may be used as well.

Next, an activation annealing treatment is performed on semiconductor layer 12 in which second-conductive-type impurity diffusion layer 14 and first-conductive-type impurity diffusion layer 15 have been formed in the above-described manner. Accordingly, the p-type impurity serving as a second-conductive-type impurity in second-conductive-type impurity diffusion layer 14 as well as the n-type impurity serving as a first-conductive-type impurity in first-conductive-type impurity diffusion layer 15 that have been introduced by the above-described ion implantation can be activated.

Here, the activation annealing treatment may be performed for example in an argon gas atmosphere by heating semiconductor layer 12 in which second-conductive-type impurity diffusion layer 14 and first-conductive-type impurity diffusion layer 15 have been formed, at a temperature of approximately 1700° C. for approximately 30 minutes, for example.

Figure 8:
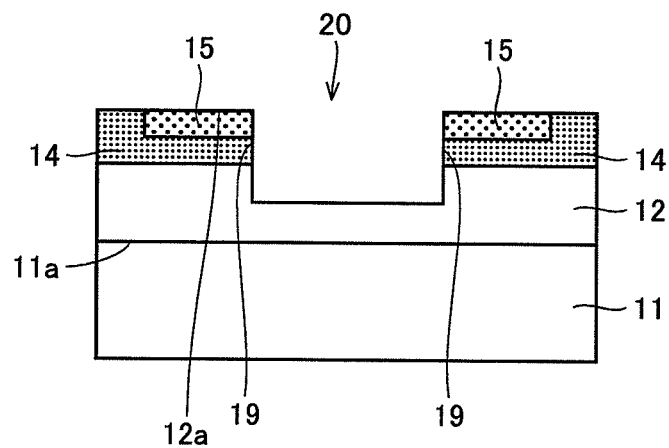
FIG. 8 is a schematic cross section illustrating a part of the manufacturing process of an example of the method of manufacturing a silicon carbide semiconductor device of the present invention.

Next, as shown in a schematic cross section of FIG. 8, trench 20 having sidewall 19 is formed in surface 12a of semiconductor layer 12. Trench 20 may be formed for example by providing an etching mask in a region other than the region where trench 20 is to be formed in surface 12a of semiconductor layer 12, and thereafter etching and thereby removing the region of surface 12a of semiconductor layer 12 where the etching mask is not provided.

Figure 9:
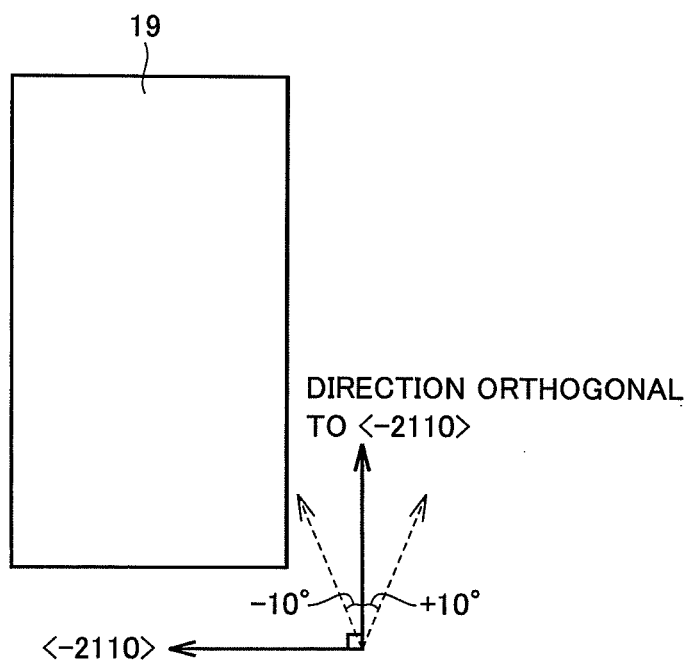
FIG. 9 is a schematic plan view illustrating an example of the sidewall of a trench in the present invention.

Here, in the case where the channel direction is to be made coincident with the direction in which sidewall 19 of trench 20 extends, for example, it is preferable to specify the direction orthogonal to the <−2110> direction with respect to a defect formed in semiconductor layer 12, and form trench 20 as shown for example in a schematic plan view of FIG. 9 so that the direction in which sidewall 19 of trench 20 extends (the upward direction in FIG. 9) is included in a range of ±10° relative to the direction orthogonal to the <−2110> direction.

The above is for the following reason. In the process of manufacturing silicon carbide semiconductor device 1, a defect could be formed at a certain portion of semiconductor layer 12. Therefore, the position of the defect formed at a certain portion of semiconductor layer 12 may be used as a reference. Then, where the channel direction is to be made coincident with the direction in which sidewall 19 of trench 20 extends for example, trench 20 can be formed easily so that the direction in which sidewall 19 of trench 20 extends is included in a range of ±10° relative to the direction orthogonal to the <−2110> direction.

Figure 10:
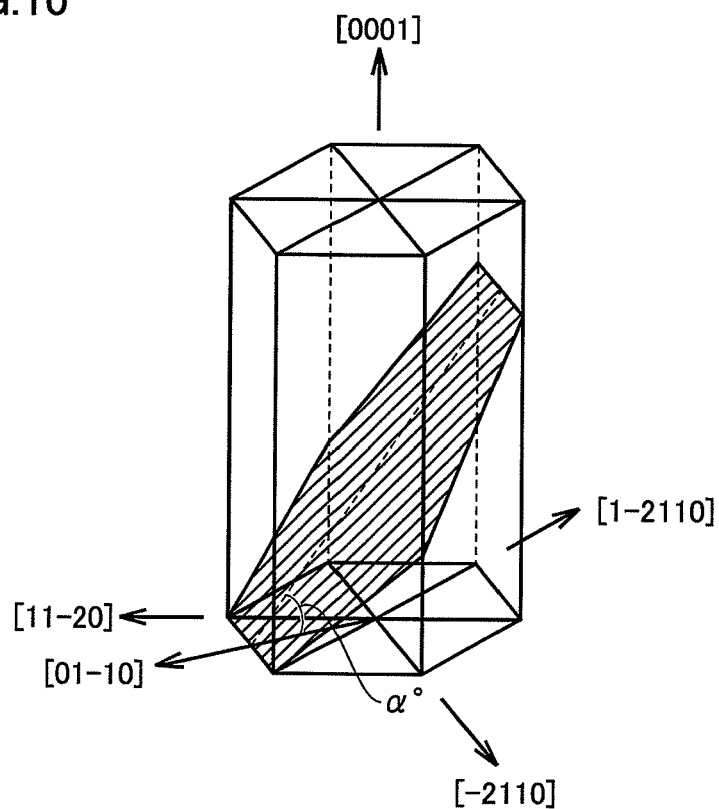
FIG. 10 is a schematic perspective view illustrating an example of a crystal plane of the sidewall of the trench in the present invention.
Figure 11:
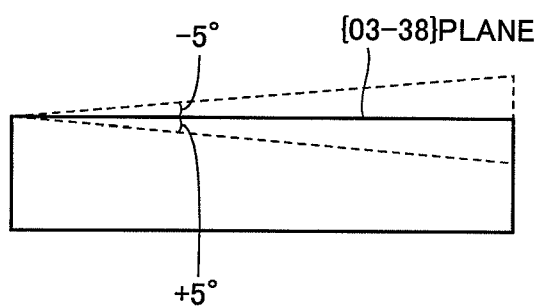
FIG. 11 is a schematic cross section illustrating a preferred example of the crystal plane of the sidewall of the trench in the present invention.

Further, as shown for example in a schematic perspective view of FIG. 10, sidewall 19 of trench 20 is formed of a crystal plane (hatched portion in FIG. 10) that is tilted at an angle α° in a range of not less than 50° and not more than 65° relative to the {0001} plane. Preferably, the crystal plane of sidewall 19 of trench 20 is also tilted at an angle in a range of ±5° relative to the {03-38} plane as shown for example in a schematic cross section of FIG. 11. In the case where sidewall 19 of trench 20 is a crystal plane tilted at an angle in a range of ±5° relative to the {03-38} plane, electrical characteristics such as channel mobility of silicon carbide semiconductor device 1 tend to be improved. In order to further improve electrical characteristics such as channel mobility of silicon carbide semiconductor device 1, preferably sidewall 19 of trench 20 is a crystal plane tilted at an angle in a range of ±3° relative to the {03-38} plane, and most preferably sidewall 19 of trench 20 is the {03-38} plane. As is evident, a crystal plane tilted at an angle in a range of ±5° relative to the {03-38} plane and a crystal plane tilted at an angle in a range of ±3° relative to the {03-38} plane each include the {03-38} plane.

Figure 12:
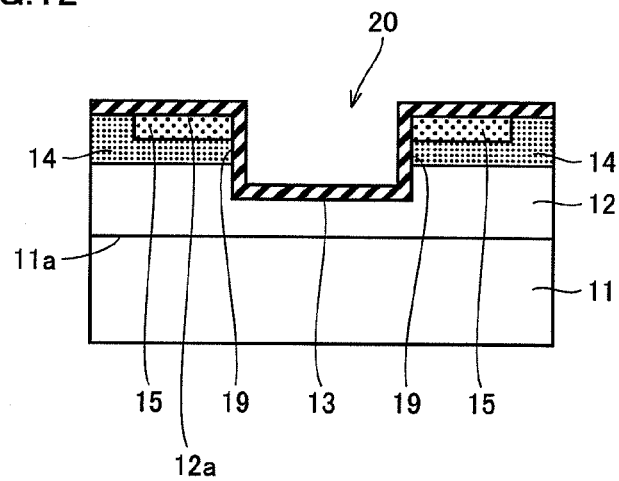
FIG. 12 is a schematic cross section illustrating a part of the manufacturing process of an example of the method of manufacturing a silicon carbide semiconductor device of the present invention.

Next, as shown in a schematic cross section of FIG. 12, insulating film 13 is formed to contact sidewall 19 of trench 20 formed in the above-described manner. Insulating film 13 can be formed to contact sidewall 19 of trench 20 that extends in the direction as controlled so that the direction in which sidewall 19 of trench 20 extends is included in a range of ±10° relative to the direction orthogonal to the <−2110> direction, and thereby set the channel direction in a range of ±10° relative to the direction orthogonal to the <−2110> direction.

Here, as insulating film 13, an oxide film or the like formed for example by dry oxidation (thermal oxidation) or the like may be used. Specifically, dry oxidation (thermal oxidation) may be performed for example in oxygen by heating surface 12a of semiconductor layer 12 in which trench 20 has been formed as described above, at a temperature of approximately 1200° C. for approximately 30 minutes for example.

Next, a nitrogen annealing treatment is performed on semiconductor layer 12 where above-described insulating film 13 has been formed. In this way, the nitrogen concentration is adjusted so that a maximum value of the nitrogen concentration in a region within 10 nm from the interface between sidewall 19 of trench 20 and insulating film 13 is not less than $1 \times 10^{21}$ cm$^{-3}$.

Here, in the above-described nitrogen annealing treatment, semiconductor layer 12 where above-described insulating film 13 has been formed is heated for example in an atmosphere of a gas containing nitrogen such as nitrogen monoxide (NO) gas at a temperature of approximately 1100° C. for approximately 120 minutes for example. In this way, a maximum value of the nitrogen concentration in the region within 10 nm from the interface between sidewall 19 of trench 20 and insulating film 13 can be set to $1 \times 10^{21}$ cm$^{-3}$ or more.

It is preferable to further perform an inert gas annealing treatment on semiconductor layer 12 having undergone the above-described nitrogen annealing treatment, in an atmosphere of an inert gas such as argon gas for example. In the case where the above-described inert gas annealing treatment is performed on semiconductor layer 12 having undergone the above-described nitrogen annealing treatment, there is a higher tendency for silicon carbide semiconductor device 1 to be able to achieve a high channel mobility with high reproducibility.

Here, the above-described inert gas annealing treatment may be performed for example in an argon gas atmosphere by heating semiconductor layer 12 having undergone the above-described nitrogen annealing treatment, at a temperature of approximately 1100° C. for approximately 60 minutes for example.

Figure 13:
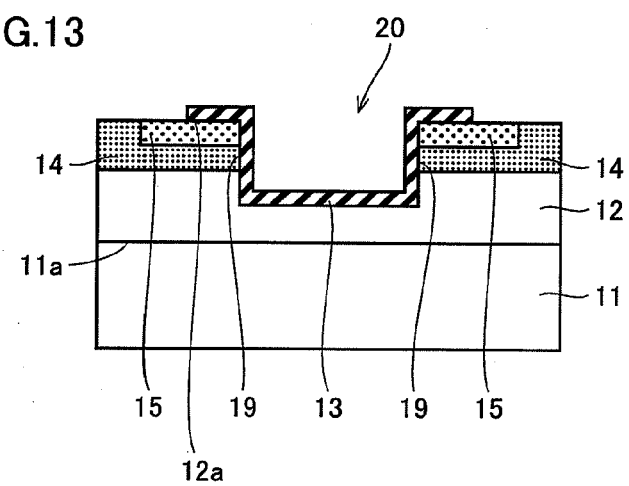
FIG. 13 is a schematic cross section illustrating a part of the manufacturing process of an example of the method of manufacturing a silicon carbide semiconductor device of the present invention.

Next, as shown in a schematic cross section of FIG. 13, a part of insulating film 13 formed as described above is removed to pattern insulating film 13.

Here, patterning of insulating film 13 is performed by removing a part of insulating film 13 so that at least a part of the surface of first-conductive-type impurity diffusion layer 15 in surface 12a of semiconductor layer 12 is exposed.

Further, a part of insulating film 13 may be removed for example by forming, on the surface of insulating film 13, an etching mask patterned by means of photolithography and etching for exposing a part to be removed of insulating film 13, for example, and thereafter etching and thereby removing the exposed part of insulating film 13.

Next, as shown in FIG. 1, source electrode 16 is formed to contact the exposed surface of first-conductive-type impurity diffusion layer 15 in surface 12a of semiconductor layer 12 that is exposed from the part where insulating film 13 has been removed.

Here, source electrode 16 may be formed for example by performing sputtering for example to form an electrically conductive film made of a metal such as nickel for example, on surface 12a of semiconductor layer 12 exposed after the above-described etching of insulating film 13 and on the surface of the above-described etching mask, and thereafter removing this etching mask. In other words, the conductive film formed on the surface of the etching mask is removed (lifted off) together with the etching mask while only the conductive film formed on surface 12a of semiconductor layer 12 is left to serve as source electrode 16.

Preferably, a heat treatment for achieving alloying is performed on semiconductor layer 12 on which above-described source electrode 16 has been formed.

Here, the heat treatment for achieving alloying may be performed for example in an atmosphere of an inert gas such as argon gas by heating semiconductor layer 12 on which above-described source electrode 16 has been formed, at a temperature of approximately 950° C. for approximately two minutes for example.

Next, as shown in FIG. 1, gate electrode 17 is formed on a surface of insulating film 13. Here, gate electrode 17 may be formed for example by performing photolithography and etching or the like to form a resist mask having an opening corresponding to a portion where gate electrode 17 is to be formed and covering respective entire surfaces of insulating film 13 and source electrode 16, then performing for example sputtering or the like to form an electrically conductive film made of a metal such as aluminum for example, on the surface of the resist mask and on the surface of insulating film 13 that is exposed from the opening of the resist mask, and thereafter removing this resist mask. In other words, the conductive film formed on the surface of the resist mask is removed (lifted off) together with the resist mask while only the conductive film formed on the surface of insulating film 13 is left to serve as gate electrode 17.

Next, as shown in FIG. 1, drain electrode 18 is formed on the back surface of substrate 11. Here, drain electrode 18 may be formed for example by performing for example sputtering or the like to form an electrically conductive film made of a metal such as nickel for example, on the back surface of substrate 11.

In this way, silicon carbide semiconductor device 1 with the structure shown in FIG. 1 can be manufactured.

Figure 14:
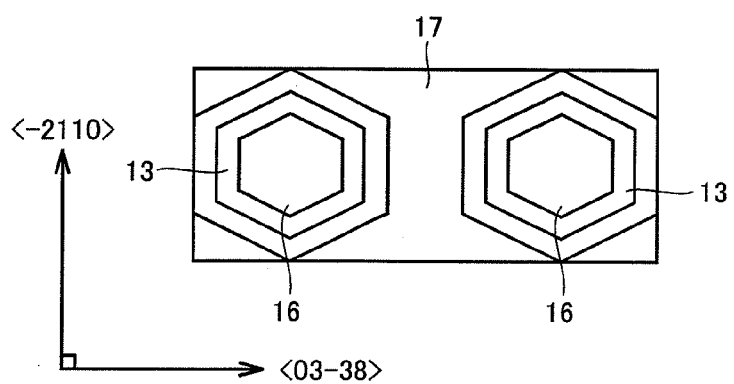
FIG. 14 is a schematic plan view of another example of the silicon carbide semiconductor device of the present invention as seen from the gate electrode side.

In silicon carbide semiconductor device 1 of the present invention, the surface of source electrode 16 may be formed in a honeycomb pattern and a region except for a partial region surrounding the outer periphery of source electrode 16 may be formed as gate electrode 17 as shown for example in a schematic plan view of FIG. 14.

In the case where the surface of source electrode 16 is formed in a honeycomb pattern as described above, the surface of each source electrode 16 is formed in the shape of a hexagon. In particular, the surface of source electrode 16 is preferably formed in the shape of a regular hexagon. In the case where each source electrode 16 has its surface formed in the shape of a regular hexagon, the possible number of silicon carbide semiconductor devices 1 to be formed from substrate 11 of the same size can be increased. Therefore, there is a tendency that silicon carbide semiconductor device 1 having a high channel mobility can be fabricated with higher reproducibility and at a higher manufacturing efficiency. In this case, second-conductive-type impurity diffusion layer 14 and first-conductive-type impurity diffusion layer 15 may also be formed in a hexagonal shape such as regular hexagonal shape.

Other features of silicon carbide semiconductor device 1 having source electrode 16 and gate electrode 17 structured as shown in FIG. 14 may be similar to the above-described ones.

In silicon carbide semiconductor device 1 structured in the above-described manner, when a negative voltage is applied to source electrode 16 and a positive voltage is applied to gate electrode 17 and drain electrode 18 for example, carriers (electrons in the above-described example) injected from source electrode 16 move to drain electrode 18 through the surface of first-conductive-type impurity diffusion layer 15, sidewall 19 of trench 20, the inside of semiconductor layer 12, and the inside of substrate 11.

If a negative voltage is applied to source electrode 16 and a positive voltage is applied to drain electrode 18 while the positive voltage is not applied to gate electrode 17, carriers (electrons in the above-described example) injected from source electrode 16 will be restricted in movement in the surface of second-conductive-type impurity diffusion layer 14 in sidewall 19 of trench 20.

Figure 15:
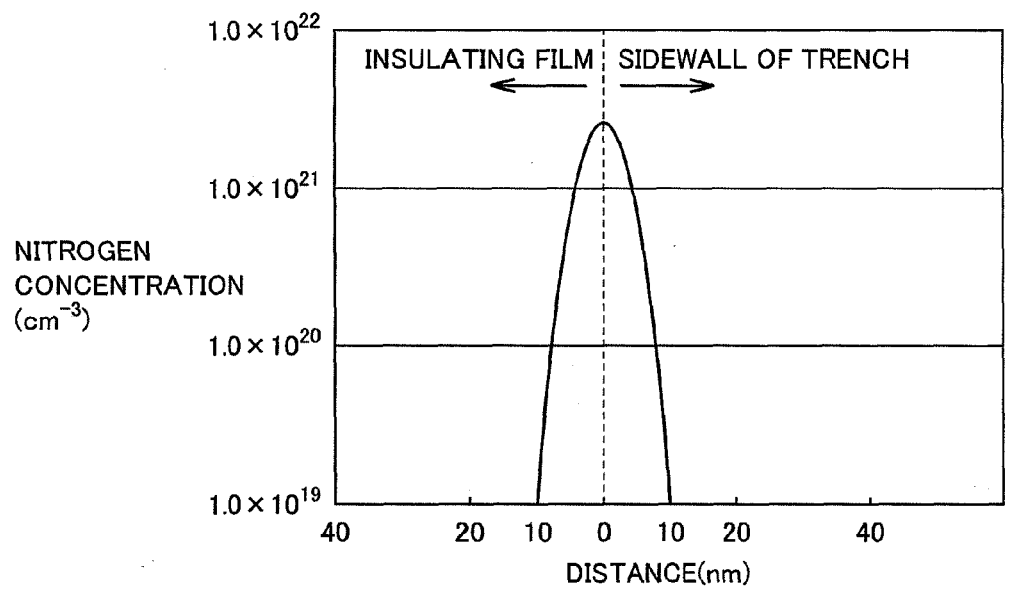
FIG. 15 is a diagram showing an example of a nitrogen concentration distribution in the vicinity of the interface between the sidewall of a trench and an insulating film in an example of the silicon carbide semiconductor device of the present invention.

In silicon carbide semiconductor device 1 of the present invention, a maximum value of the nitrogen concentration in a region within 10 nm from the interface between sidewall 19 of trench 20 and insulating film 13 is not less than $1\times10^{21}$ $cm^{-3}$ as shown for example in FIG. 15. Therefore, in silicon carbide semiconductor device 1 of the present invention, the number of interface states that occur when insulating film 13 is formed by dry oxidation (thermal oxidation) or the like at the interface between sidewall 19 of trench 20 and insulating film 13 can be reduced. Accordingly, particularly in a channel directly below insulating film 13 (the portion of sidewall 19 of trench 20 contacting insulating film 13), the carrier mobility (channel mobility) can stably be improved.

FIG. 15 shows an example of the nitrogen concentration in the vicinity of the interface between sidewall 19 of trench 20 and insulating film 13 in silicon carbide semiconductor device 1 with the above-described structure. Here, in FIG. 15, the vertical axis represents the nitrogen concentration ($cm^{-3}$) and the horizontal axis represents the distance (nm) from the interface between sidewall 19 of trench 20 and insulating film 13. Further, in FIG. 15, the portion where the distance (nm) on the horizontal axis is 0 (nm) represents the interface between sidewall 19 of trench 20 and insulating film 13. The extension in the leftward direction with respect to the portion of 0 (nm) on the horizontal axis of the distance (nm) represents extension in the direction toward insulating film 13 side, while the extension in the rightward direction with respect to the portion of 0 (nm) on the horizontal axis of the distance (nm) represents extension in the direction toward sidewall 19 side of trench 20.

Further, silicon carbide semiconductor device 1 with the above-described structure has the channel direction in a range of ±10° relative to the direction orthogonal to the <−2110> direction in sidewall 19 of trench 20. Carriers therefore move smoothly in this channel direction, and the carrier mobility in this channel direction and electric current characteristics can be improved. Accordingly, the ON resistance of silicon carbide semiconductor device 1 can be reduced.

Figure 16:
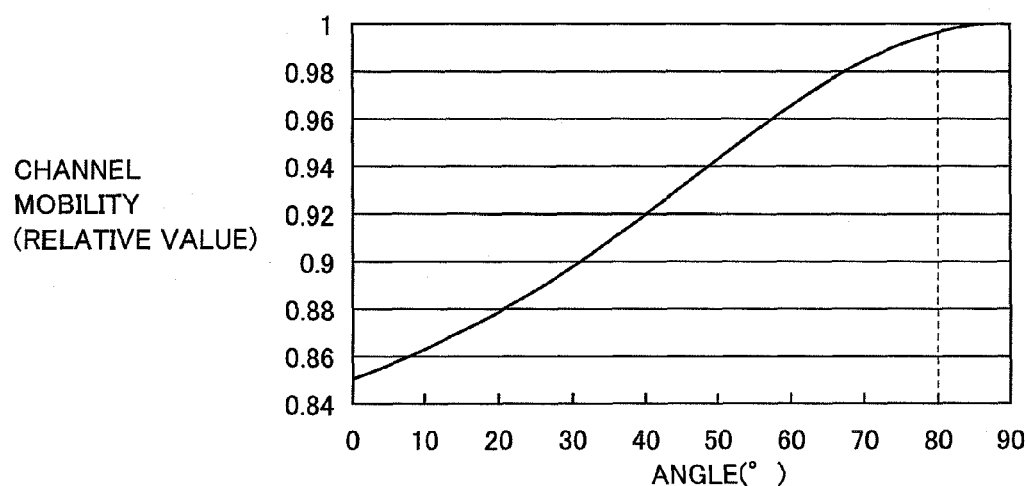
FIG. 16 is a diagram showing an example of the relation between an angle (°) relative to the <-2110> direction and a channel mobility (relative value) in the sidewall of the trench in an example of the silicon carbide semiconductor device of the present invention.

FIG. 16 shows an example of the relation between the channel mobility (relative value) and the angle (°) relative to the <−2110> direction in sidewall 19 of trench 20 (in the crystal plane tilted by an angle in a range of not less than 50° and not more than 65° relative to the {0001} plane) of silicon carbide semiconductor device 1 with the above-described structure. In FIG. 16, the vertical axis represents the channel mobility (relative value) and the horizontal axis represents the angle (°) relative to the <−2110> direction in sidewall 19 of trench 20. As to the angle (°) on the horizontal axis in FIG. 16, the angle is not distinguished in terms of the direction of tilt relative to the <−2110> direction. Therefore, 80° on the horizontal axis for example represents both the direction tilted by +80° relative to the <−2110> direction and the direction tilted by −80° relative to the <−2110> direction.

The channel mobility (relative value) on the vertical axis in FIG. 16 is indicated by a relative value with respect to 1 of the channel mobility in the direction orthogonal to the <−2110> direction in sidewall 19 of trench 20. Further, the portion where the angle is 90° on the horizontal axis in FIG. 16 indicates the direction orthogonal to the <−2110> direction in sidewall 19 of trench 20.

As shown in FIG. 16, it is seen that the channel mobility is highest when the channel direction extends in the direction at an angle of 90° relative to the <−2110> direction (the direction orthogonal to the <−2110> direction) in sidewall 19 of trench 20, while the channel mobility tends to be smaller as a deviation is larger from the direction orthogonal to the <−2110> direction in sidewall 19 of trench 20. The tendency seen from FIG. 16 is also satisfied by any crystal plane of sidewall 19 of trench 20 that is tilted at an angle in a range of not less than 50° and not more than 65° relative to the {0001} plane.

Thus, in order to achieve a high channel mobility, it would be most preferable to have the channel direction orthogonal to the <−2110> direction in sidewall 19 of trench 20 (crystal plane tilted at an angle in a range of not less than 50° and not more than 65° relative to the {0001} plane) (namely the direction of ±0° orthogonal to the <−2110> direction).

However, as shown in FIG. 16, in the case where the channel direction is a direction at an angle of not less than 80° and not more than 90° relative to the <-2110> direction in sidewall 19 of trench 20 (namely a direction in a range of ±10° relative to the direction orthogonal to the <-2110> direction), the channel mobility (relative value) is higher than 0.99. Therefore, even when the channel mobility varies to a certain extent due to a problem or the like in manufacture, the channel mobility would unlikely to be deteriorated to a large extent.

As seen from the above, in silicon carbide semiconductor device 1 of the present invention having a channel direction in a range of ±10° relative to the direction orthogonal to the <-2110> direction in sidewall 19 of trench 20, a high channel mobility can be achieved with high reproducibility. Further, in order to achieve a high channel mobility with high reproducibility in silicon carbide semiconductor device 1 of the present invention, it is most preferable that the channel direction is set in the direction orthogonal to the <-2110> direction in sidewall 19 of trench 20 as described above.

While the above description refers to the n-type as the first conductive type and the p-type as the second conductive type, the present invention may be constructed so that the first conductive type is the p-type and the second conductive type is the n-type in the structure of the above-described silicon carbide semiconductor device 1.

EXAMPLES

Fabrication of Vertical Trench Gate MOSFET

A silicon carbide semiconductor device was formed as a vertical trench gate MOSFET of an Example in the following way.

Figure 3:
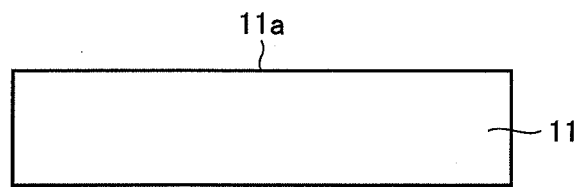
FIG. 3 is a schematic cross section illustrating a part of a manufacturing process of an example of the method of manufacturing a silicon carbide semiconductor device of the present invention.

First, as shown in FIG. 3, substrate 11 formed of an n-type silicon carbide crystal (4H—SiC) with a thickness of 400 µm was prepared. Here, substrate 11 had surface 11a formed of a crystal plane that is a {04-4-3} plane.

Next, as shown in FIG. 4, semiconductor layer 12 (n-type impurity concentration: $5 \times 10^{15}$ cm$^{-3}$) formed of an n-type silicon carbide crystal doped with nitrogen as an n-type impurity was epitaxially grown to a thickness of 10 µm on surface 11a of substrate 11 by means of CVD (Chemical Vapor Deposition).

Figure 5:
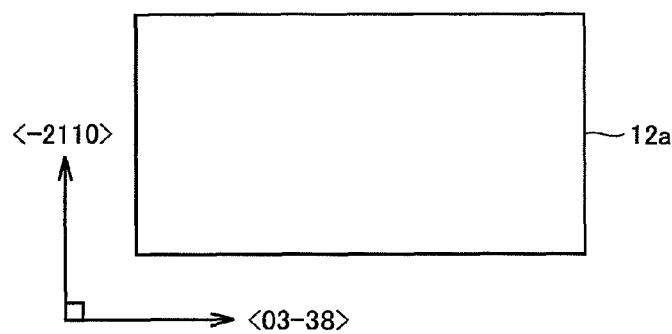
FIG. 5 is a schematic plan view illustrating an example of a surface of a semiconductor layer of the present invention.

Here, surface 12a of semiconductor layer 12 was formed of a crystal plane that is a {04-4-3} plane having the <-2110> direction and the <03-38> direction orthogonal to the <-2110> direction as shown in FIG. 5.

Next, as shown in FIG. 6, second-conductive-type impurity diffusion layer 14 (p-type impurity concentration: $1 \times 10^{17}$ cm$^3$) was formed in surface 12a of semiconductor layer 12. Here, second-conductive-type impurity diffusion layer 14 was formed by using photolithography and etching to form a patterned oxide film in a region other than the region where second-conductive-type impurity diffusion layer 14 was to be formed in surface 12a of semiconductor layer 12, and implanting ions of boron as a p-type impurity using the oxide film as an ion implantation block mask. Second-conductive-type impurity diffusion layer 14 was formed in a stripe pattern extending in the <-2110> direction.

Next, as shown in FIG. 7, in a surface of second-conductive-type impurity diffusion layer 14 formed in the above-described manner, first-conductive-type impurity diffusion layer 15 (n-type impurity concentration: $5 \times 10^{19}$ cm$^{-3}$) and a p+-type region (not shown) (p-type impurity concentration: $3 \times 10^{19}$ cm$^3$) were formed. Here, first-conductive-type impurity diffusion layer 15 was formed in a stripe pattern extending in the <-2110> direction, and the p+-type region was formed in a stripe pattern extending in the <-2110> direction on the outside of first-conductive-type impurity diffusion layer 15 shown in FIG. 7 to contact first-conductive-type impurity diffusion layer 15.

First-conductive-type impurity diffusion layer 15 was formed by using photolithography and etching to form a patterned oxide film in a region other than the region where first-conductive-type impurity diffusion layer 15 was to be formed in surface 12a of semiconductor layer 12, and implanting ions of phosphorous as an n-type impurity using the oxide film as an ion implantation block mask. The p+-type region was also formed by using photolithography and etching to form a patterned oxide film in a region other than the region where the p+-type region was to be formed in surface 12a of semiconductor layer 12, and implanting ions of boron as a p-type impurity using the oxide film as an ion implantation block mask.

Next, an activation annealing treatment was performed by heating semiconductor layer 12 in which second-conductive-type impurity diffusion layer 14, first-conductive-type impurity diffusion layer 15, and the p+-type region were formed in the above-described manner, in an argon gas atmosphere at 1700° C. for 30 minutes.

Next, as shown in FIG. 8, trench 20 having sidewall 19 was formed in surface 12a of semiconductor layer 12. Trench 20 may be formed for example by providing an etching mask in a region other than the region where trench 20 was to be formed in surface 12a of semiconductor layer 12, and thereafter performing etching perpendicularly to surface 12a of semiconductor layer 12 to remove the region where the etching mask was not provided and thus trench 20 was to be formed in surface 12a of semiconductor layer 12. Here, trench 20 was formed in the following way. A defect formed in semiconductor layer 12 was used as a reference to specify the direction orthogonal to the <-2110> direction. As shown in FIG. 9, in order to allow the channel direction to be coincident with the direction in which sidewall 19 of trench 20 extends, trench 20 was formed so that the direction of extension of sidewall 19 of trench 20 was included in a range of ±10° relative to the direction orthogonal to the <-2110> direction. Accordingly, sidewall 19 of trench 20 was formed of the {03-38} plane which was a crystal plane tilted at an angle of about 55° relative to the {0001} plane. Further, sidewall 19 of trench 20 extended perpendicularly to surface 12a ({04-4-3} plane) of semiconductor layer 12.

Next, as shown in FIG. 12, surface 12a of semiconductor layer 12 was heated in oxygen at 1200° C. for 30 minutes to be dry-oxidized (thermally oxidized) and thereby form insulating film 13 contacting the whole of surface 12a of semiconductor layer 12.

Next, a nitrogen annealing treatment was performed by heating semiconductor layer 12 on which insulating film 13 had been formed, in a nitrogen monoxide (NO) gas atmosphere at 1100° C. for 120 minutes.

Next, an inert gas annealing treatment was performed by heating semiconductor layer 12 having undergone the above-described nitrogen annealing treatment, in an argon gas atmosphere at 1100° C. for 60 minutes.

Next, as shown in FIG. 13, insulating film 13 was patterned by removing a part of insulating film 13 so that a part of the surface of first-conductive-type impurity diffusion layer 15 and the surface of the p+-type region (not shown) in surface 12a of semiconductor layer 12 were exposed. Here, patterning of insulating film 13 was performed by forming, on the surface of insulating film 13, an etching mask patterned by photolithography and etching in order to expose a part-to-beremoved of insulating film 13, and thereafter etching and thereby removing the exposed part of insulating film 13.

Next, on the surface of first-conductive-type impurity diffusion layer 15 and the surface of the p+-type region (not shown) that have been exposed from the portion where insulating film 13 was removed, source electrode 16 was formed that was made of nickel and having its surface in the shape of a regular hexagon as shown in FIG. 14 and a thickness of 0.1 μm.

Next, semiconductor layer 12 on which above-described source electrode 16 had been formed was heat-treated for alloying, by being heated in an argon gas atmosphere at 950° C. for two minutes.

Next, on the surface of insulating film 13, gate electrode 17 was formed that was made of aluminum and having a surface shape as shown in FIG. 14 and a thickness of 1 μm.

Next, on the whole of the rear surface of substrate 11, drain electrode 18 of nickel with a thickness of 0.1 μm was formed.

In this way, silicon carbide semiconductor device 1 was fabricated as a vertical trench gate MOSFET of the Example.

Silicon carbide semiconductor device 1 to serve as a vertical trench gate MOSFET of the Example fabricated in the above-described manner had a channel length (the length, along the direction in which sidewall 19 extends, of first-conductive-type impurity diffusion layer 15 exposed on sidewall 19 of trench 20) was set to 2 μm.

Further, for comparison's sake, a silicon carbide semiconductor device to serve as a vertical trench gate MOSFET of a Comparative Example was fabricated in a manner similar to the above-described one, except that the channel direction of sidewall 19 of trench 20 in surface 12a was the <−2110> direction.

Evaluation of Vertical Trench Gate MOSFET

For the vertical trench gate MOSFETs of the Example and the Comparative Example fabricated in the above-described manner, the distribution, in the depth direction, of the nitrogen concentration in the vicinity of the interface between sidewall 19 of trench 20 and insulating film 13 was measured by SIMS (secondary ion mass spectrometry).

As a result, it was found that the maximum value of the nitrogen concentration in the vicinity of the interface between sidewall 19 of trench 20 and insulating film 13 was $1 \times 10^{21}$ cm$^{-3}$ or more in both of respective vertical trench gate MOSFETs of the Example and the Comparative Example. It was thus confirmed that the maximum value of the nitrogen concentration in a region within 10 nm from the interface between sidewall 19 of trench 20 and insulating film 13 was not less than $1 \times 10^{21}$ cm$^{-3}$ in each of respective vertical trench gate MOSFETs of the Example and the Comparative Example.

Further, for the vertical trench gate MOSFETs of the Example and the Comparative Example, the channel mobility was evaluated. For evaluating the channel mobility, the following method was used. First, under the condition that the source-drain voltage was VDS=0.1 V, a gate voltage VG was applied to measure a source-drain current IDS (to measure the gate voltage dependency). Then, Expression (1) below where gm=(δIDS)/(δVG) was used to determine the maximum value of the channel mobility for the gate voltage, and the maximum value was calculated as the channel mobility.

$$\text{Channel mobility } \mu = gm \times (L \times d)/(W \times \in \times VDS) \quad (1)$$

In Expression (1) above, L represents the channel length, d represents the thickness of insulating film 13, W represents the channel width, and ∈ represents the dielectric constant of insulating film 13.

Consequently, it was found that the channel mobility of the vertical trench gate MOSFET of the Example was 100 cm²/Vs and the channel mobility of the vertical trench gate MOSFET of the Comparative Example was 40 cm²/Vs.

As seen from the above, the channel mobility of the vertical trench gate MOSFET of the Example was 2.5 times as high as the channel mobility of the vertical trench gate MOSFET of the Comparative Example, and accordingly the source-drain current value was 2.5 times. Thus, a significant reduction in ON resistance was confirmed.

It is therefore considered that in the structure of the vertical trench gate MOSFET of the Example, the channel mobility is unlikely to considerably decrease even when the channel mobility varies depending on problems in manufacture, and thus a high channel mobility can be achieved with high reproducibility.

It should be construed that embodiments and examples disclosed herein are by way of illustration in all respects, not by way of limitation. It is intended that the scope of the present invention is defined by claims, not by the description above, and encompasses all modifications and variations equivalent in meaning and scope to the claims.

INDUSTRIAL APPLICABILITY

Since the present invention can provide a silicon carbide semiconductor device that can achieve a high channel mobility with high reproducibility as well as a method of manufacturing the same, the present invention is suitably applicable for example to a vertical trench gate MOSFET and the like in which SiC is used.

DESCRIPTION OF THE REFERENCE SIGNS 1 silicon carbide semiconductor device; 11 substrate; 11a surface; 12 semiconductor layer; 12a surface; 13 insulating film; 14 second-conductive-type impurity diffusion layer; 15 first-conductive-type impurity diffusion layer; 16 source electrode; 17 gate electrode; 18 drain electrode; 19 sidewall; 20 trench.

The invention claimed is:

1. A silicon carbide semiconductor device comprising:
   a semiconductor layer made of silicon carbide and having
      a surface with a trench having a sidewall formed of a crystal plane tilted at an angle in a range of not less than 50° and not more than 65° relative to a {0001} plane; and
   an insulating film formed to contact said sidewall of said trench,
   a region within 10 nm from an interface between said sidewall of said trench and said insulating film comprises a maximum value of a nitrogen concentration of not less than $1 \times 10^{21}$ cm$^{-3}$, and
   said silicon carbide semiconductor device having a channel direction in a range of ±10° relative to a direction orthogonal to a <−2110> direction in said sidewall of said trench.

2. A silicon carbide semiconductor device comprising:
   a substrate made of silicon carbide of a first conductive type;
   a semiconductor layer made of silicon carbide of the first conductive type, formed on said substrate, containing a first-conductive-type impurity of a lower concentration than said substrate, and having a surface with a trench having a sidewall formed of a crystal plane tilted at an angle in a range of not less than 50° and not more than 65° relative to a {0001} plane;

a second-conductive-type impurity diffusion layer formed in said sidewall of said trench;
a first-conductive-type impurity diffusion layer formed in the surface of said semiconductor layer;
an insulating film formed to contact said sidewall of said trench;
a source electrode formed to contact at least a part of a region, except for a portion where said insulating film is formed, of said surface of said semiconductor layer;
a gate electrode formed on said insulating film; and
a drain electrode formed on a surface of said substrate opposite to a surface of said substrate on which said semiconductor layer is formed,
a region within 10 nm from an interface between said sidewall of said trench and said insulating film comprises a maximum value of a nitrogen concentration of not less than $1\times10^{21}$ cm$^{-3}$, and
said silicon carbide semiconductor device having a channel direction in a range of ±10° relative to a direction orthogonal to a <−2110> direction in said sidewall of said trench.

3. The silicon carbide semiconductor device according to claim 2, wherein said source electrode has a surface in a stripe pattern.

4. The silicon carbide semiconductor device according to claim 2, wherein said source electrode has a surface in a honeycomb pattern.

5. The silicon carbide semiconductor device according to claim 1, wherein said sidewall of said trench is formed of a crystal plane tilted at an angle of ±5° relative to a {03-38} plane.

6. A method of manufacturing a silicon carbide semiconductor device, comprising the steps of:
forming a trench having a sidewall formed of a crystal plane tilted at an angle in a range of not less than 50° and not more than 65° relative to a {0001} plane, in a surface of a semiconductor layer made of silicon carbide;
forming an insulating film contacting said sidewall of said trench so that a channel direction is set in a range of ±10° relative to a direction orthogonal to a <−2110> direction in said sidewall of said trench; and
adjusting a nitrogen concentration so that a region within 10 nm from an interface between said sidewall of said trench and said insulating film comprises a maximum value of a nitrogen concentration of not less than $1\times10^{21}$ cm$^{-3}$.

7. The method of manufacturing a silicon carbide semiconductor device according to claim 6, wherein the channel direction is set in a range of ±10° relative to the direction orthogonal to the <−2110> direction in said sidewall of said trench, based on an orientation of a defect included in said semiconductor layer.

8. The method of manufacturing a silicon carbide semiconductor device according to claim 6, wherein said step of adjusting the nitrogen concentration includes the step of performing a heat treatment in an atmosphere of a gas containing nitrogen, on said semiconductor layer where said insulating film is formed.

9. The method of manufacturing a silicon carbide semiconductor device according to claim 8, wherein said step of adjusting the nitrogen concentration includes the step of performing, on said semiconductor layer having undergone said heat treatment, a heat treatment in an atmosphere of an inert gas.

* * * * *